United States Patent
Sugawara et al.

(10) Patent No.: US 11,147,185 B2
(45) Date of Patent: Oct. 12, 2021

(54) HEAT SINK AND ELECTRONIC DEVICE

(71) Applicant: Sony Interactive Entertainment Inc., Tokyo (JP)

(72) Inventors: Nobuyuki Sugawara, Chiba (JP); Keiichi Aoki, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 40 days.

(21) Appl. No.: 15/659,741

(22) Filed: Jul. 26, 2017

(65) Prior Publication Data

US 2018/0042136 A1    Feb. 8, 2018

(30) Foreign Application Priority Data

Aug. 2, 2016    (JP) .............................. JP2016-152221

(51) Int. Cl.
*H05K 7/20* (2006.01)
*H01L 23/427* (2006.01)
(Continued)

(52) U.S. Cl.
CPC .......... *H05K 7/20154* (2013.01); *G06F 1/20* (2013.01); *H01L 23/427* (2013.01);
(Continued)

(58) Field of Classification Search
CPC ............ H05K 7/20154; H05K 7/20336; F28D 15/0275; H01L 23/427; H01L 23/467
(Continued)

(56) References Cited

U.S. PATENT DOCUMENTS 7,021,368 B2 * 4/2006 Lin ...................... H01L 23/427
                                                       165/104.33
7,768,784 B2 * 8/2010 Lai ...................... H01L 23/4093
                                                       165/104.33
(Continued)

FOREIGN PATENT DOCUMENTS

CN       2775835 Y    4/2006
CN     101621907 A    1/2010
(Continued)

OTHER PUBLICATIONS

Extended European Search Report for corresponding EP Application No. 17183626.5, 7 pages, dated Jan. 25, 2018.
(Continued)

*Primary Examiner* — Joel M Attey
*Assistant Examiner* — For K Ling
(74) *Attorney, Agent, or Firm* — Matthew B. Dernier, Esq.

(57) ABSTRACT

A heat sink includes a plurality of fins arrayed in a first direction, and a heat pipe having a first extension extending in the first direction. A second direction extends perpendicularly to the first direction, a third direction extends perpendicularly to the first direction and the second direction, and when the heat pipe is viewed in the third direction, the heat pipe has a second extension spaced from the first extension in the second direction and extending in the first direction, and a joint which interconnects the first extension and the second extension and which is curved. The fins include a plurality of first fins arrayed along the first extension and the second extension and a second fin disposed around a position of the joint.

11 Claims, 7 Drawing Sheets

(51) Int. Cl.
  *H01L 23/467* (2006.01)
  *G06F 1/20* (2006.01)
  *H01L 23/367* (2006.01)
(52) U.S. Cl.
  CPC ....... *H01L 23/467* (2013.01); *H05K 7/20336* (2013.01); *H05K 7/20409* (2013.01); *H01L 23/3672* (2013.01)
(58) Field of Classification Search
  USPC ...................................................... 165/80.3
  See application file for complete search history.

(56) References Cited

U.S. PATENT DOCUMENTS

| | | | | |
|---|---|---|---|---|
| 7,913,749 B2* | 3/2011 | Meng | ................ | H05K 7/20154 165/121 |
| 9,756,761 B2 | 9/2017 | Inoue | | |
| 2003/0141041 A1* | 7/2003 | Chen | ........................ | F28F 1/32 165/80.3 |
| 2004/0074633 A1* | 4/2004 | Liu | ........................ | B23P 15/26 165/80.3 |
| 2007/0029071 A1 | 2/2007 | Hwang | | |
| 2007/0227707 A1* | 10/2007 | Machiroutu | .......... | H01L 23/427 165/121 |
| 2008/0202726 A1* | 8/2008 | Chen | ................... | F28D 15/0266 165/80.3 |
| 2009/0107653 A1* | 4/2009 | Jiang | .................. | F28D 15/0233 165/80.3 |
| 2009/0166006 A1* | 7/2009 | Guo | .................... | F28D 15/0275 165/104.33 |
| 2009/0321058 A1 | 12/2009 | Uchimura | | |
| 2010/0000715 A1* | 1/2010 | Zheng | ................. | H01L 23/4006 165/80.3 |
| 2010/0319880 A1* | 12/2010 | Yu | ......................... | H01L 23/427 165/104.26 |
| 2011/0100604 A1 | 5/2011 | Anzai | | |
| 2011/0108244 A1* | 5/2011 | Anzai | ................... | H01L 23/427 165/104.26 |
| 2011/0155352 A1 | 6/2011 | Anzai | | |
| 2011/0226451 A1 | 9/2011 | Ikeda | | |
| 2012/0145363 A1* | 6/2012 | Peng | ..................... | H01L 23/427 165/121 |
| 2012/0318481 A1* | 12/2012 | Yuan | ................... | F28D 15/0233 165/104.26 |
| 2013/0043006 A1* | 2/2013 | Peng | ................. | H01L 23/3672 165/104.26 |
| 2014/0036440 A1 | 2/2014 | Inoue | | |
| 2017/0102186 A1 | 4/2017 | Huang | | |

FOREIGN PATENT DOCUMENTS

| | | |
|---|---|---|
| CN | 102117787 A | 7/2011 |
| CN | 103563503 A | 2/2014 |
| CN | 105258539 A | 1/2016 |
| EP | 2701479 A1 | 2/2014 |
| JP | 201194888 A | 5/2011 |
| JP | 2011119775 A | 6/2011 |
| JP | 2011138974 A | 7/2011 |
| WO | 2007099662 A1 | 9/2007 |

OTHER PUBLICATIONS

Notification of Reasons for Refusal for corresponding JP Application No. 2016-152221, 10 pages, dated May 29, 2018.
The First Office Action for corresponding CN Application No. 201710646672.3, 22 pages, dated Dec. 30, 2019.

* cited by examiner

//; HEAT SINK AND ELECTRONIC DEVICE

BACKGROUND

The present disclosure relates to a heat sink including heat pipes and an electronic device which incorporates such a heat sink therein.

Some electronic devices such as game machines, personal computers, etc. incorporate a heat sink for cooling integrated circuits included in the electronic devices. U.S. Patent Application Publication No. 2009/321058 (hereinafter referred to as Patent Document 1) discloses an example of electronic device which includes a heat sink. The disclosed heat sink has a metal plate, a heat receiver in the form of a thick plate fixed to one surface of the metal plate, and a plurality of fins fixed to the other surface of the metal plate. Integrated circuits are held against the heat receiver. Heat pipes are connected to the heat receiver for spreading heat received by the heat receiver over a wide area of the metal plate and the fins.

SUMMARY

As disclosed in Patent Document 1, the cooling capability of the heat sink is increased by the heat pipes that spread the heat received by the heat receiver over the wide area of the metal plate and the fins. As the processing rate of integrated circuits goes higher, however, there will be instances where heat sinks for cooling them should have an increased cooling capability.

It is desirable to achieve an increased cooling capability for a heat sink including heat pipes and an electronic device which is provided with such a heat sink.

According to an embodiment of the present disclosure, there is provided a heat sink including a plurality of fins arrayed in a first direction, and a heat pipe having a first extension extending in the first direction. A second direction extends perpendicularly to the first direction, a third direction extends perpendicularly to the first direction and the second direction, and when the heat pipe is viewed in the third direction, the heat pipe includes a second extension spaced from the first extension in the second direction and extending in the first direction, and a joint which interconnects the first extension and the second extension and which is curved. The fins include a plurality of first fins arrayed along the first extension and the second extension and a second fin disposed around a position of the joint. According to the present disclosure, there is also provided an electronic device which incorporates the above heat sink.

The heat sink and the electronic device are able to provide an increased cooling capability as they can radiate heat from the second fin via air flowing around the position of the joint.

DETAILED DESCRIPTION OF THE PREFERRED EMBODIMENT

Figure 1:
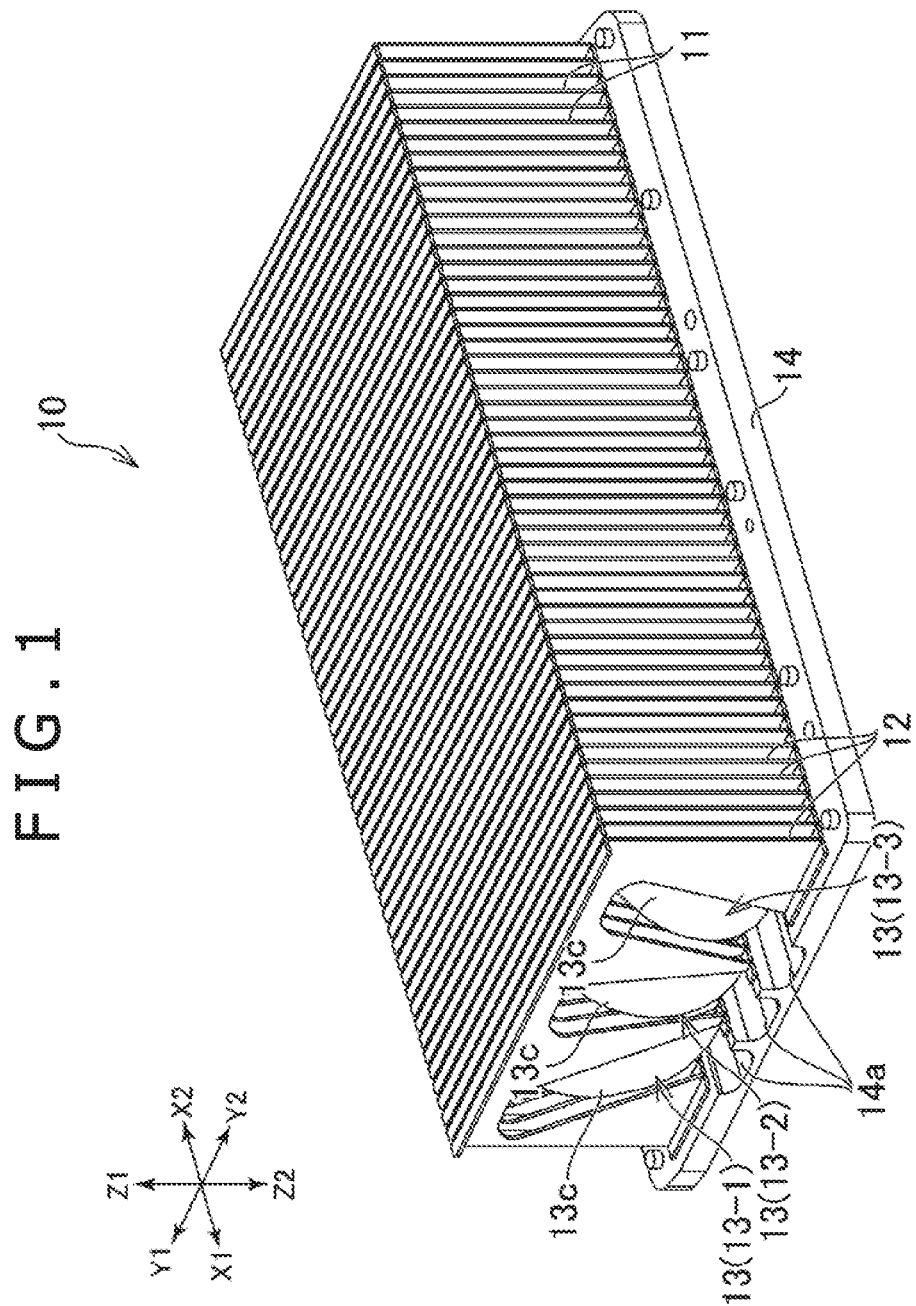
FIG. 1 is a perspective view of a heat sink according to an embodiment of the present disclosure, the view depicting a rear side of the heat sink.
Figure 2:
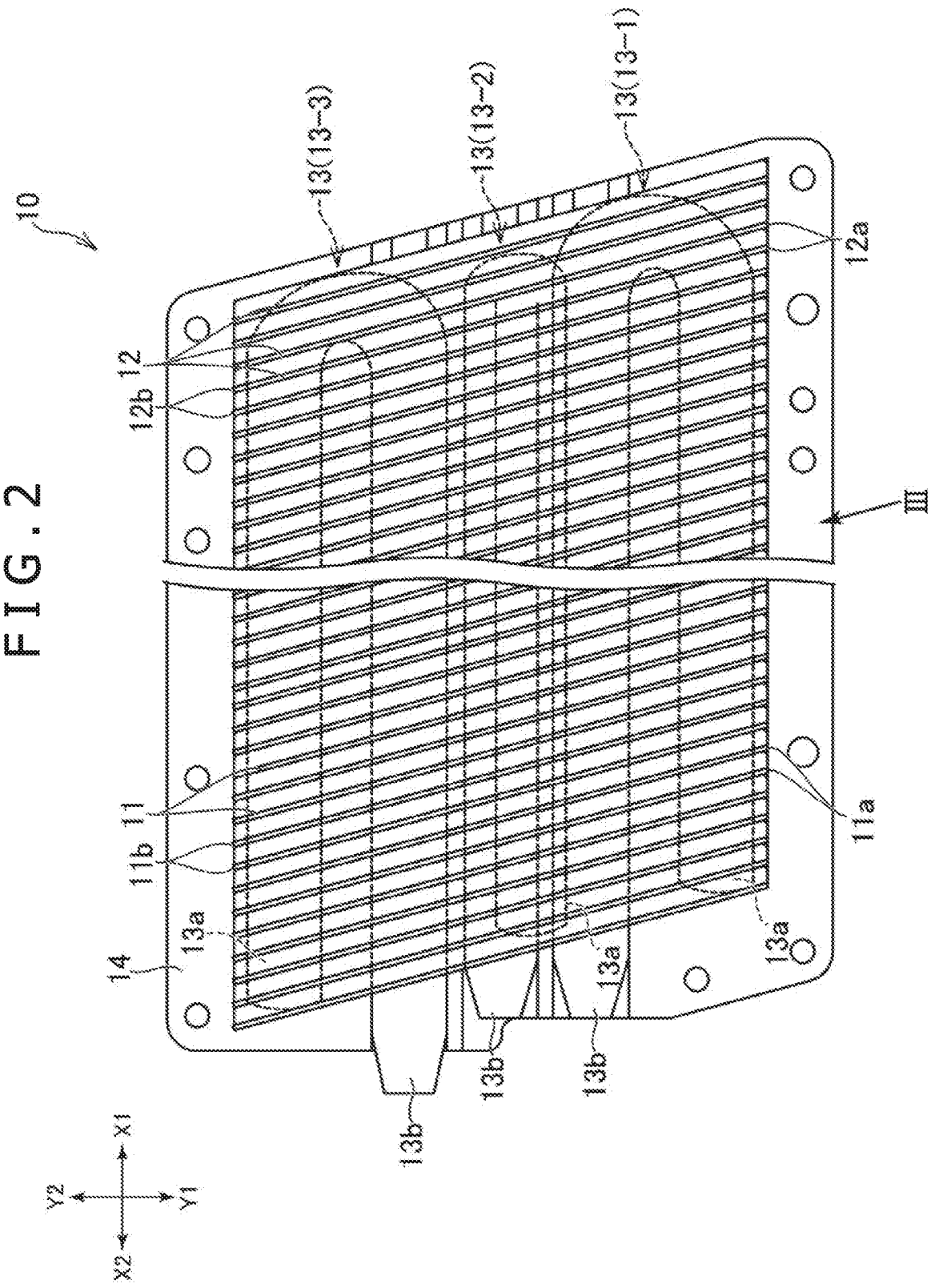
FIG. 2 is a plan view of the heat sink depicted in FIG. 1.
Figure 3:
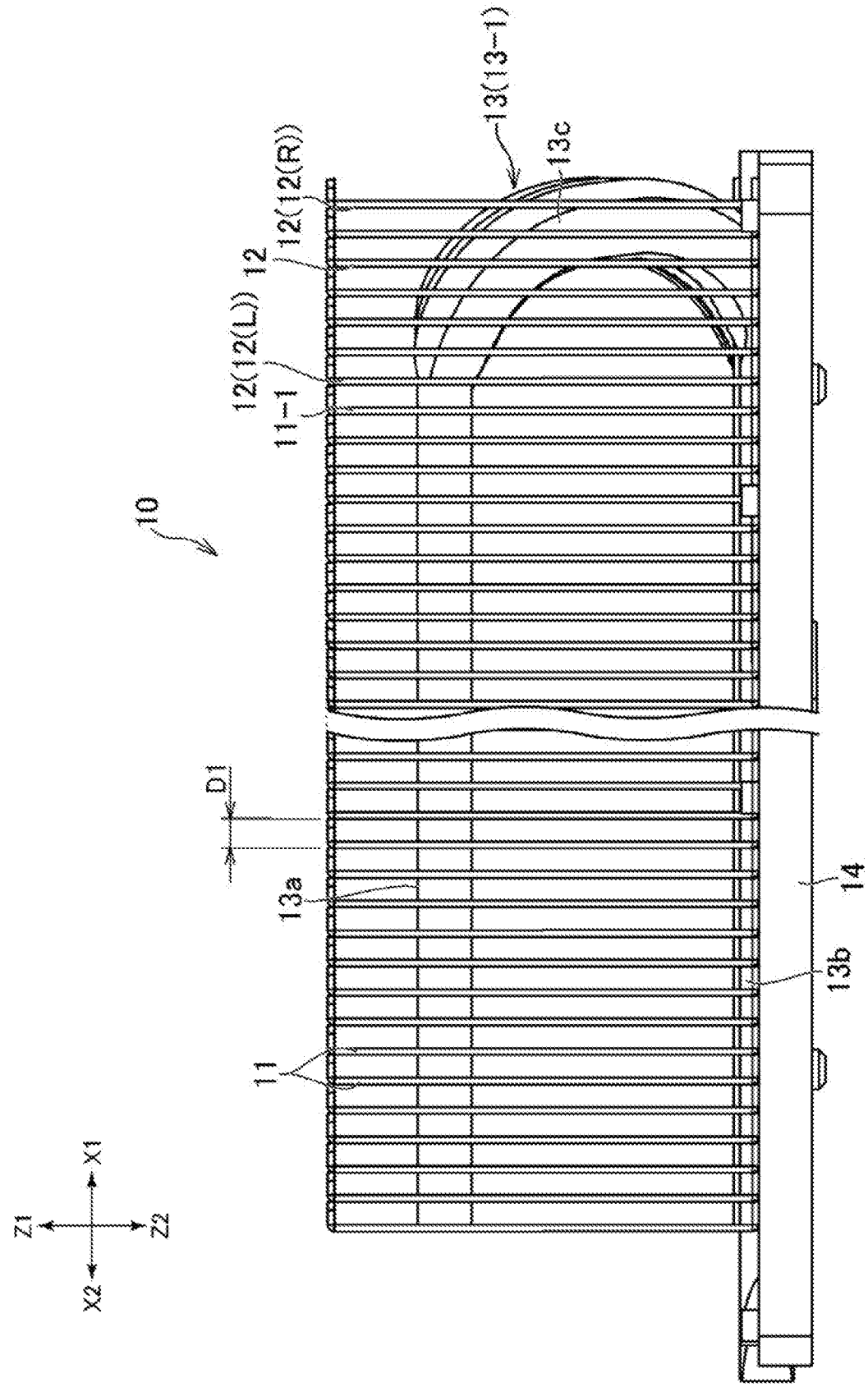
FIG. 3 is a front elevational view of the heat sink as viewed in the direction indicated by an arrow III in FIG. 2.
Figure 4:
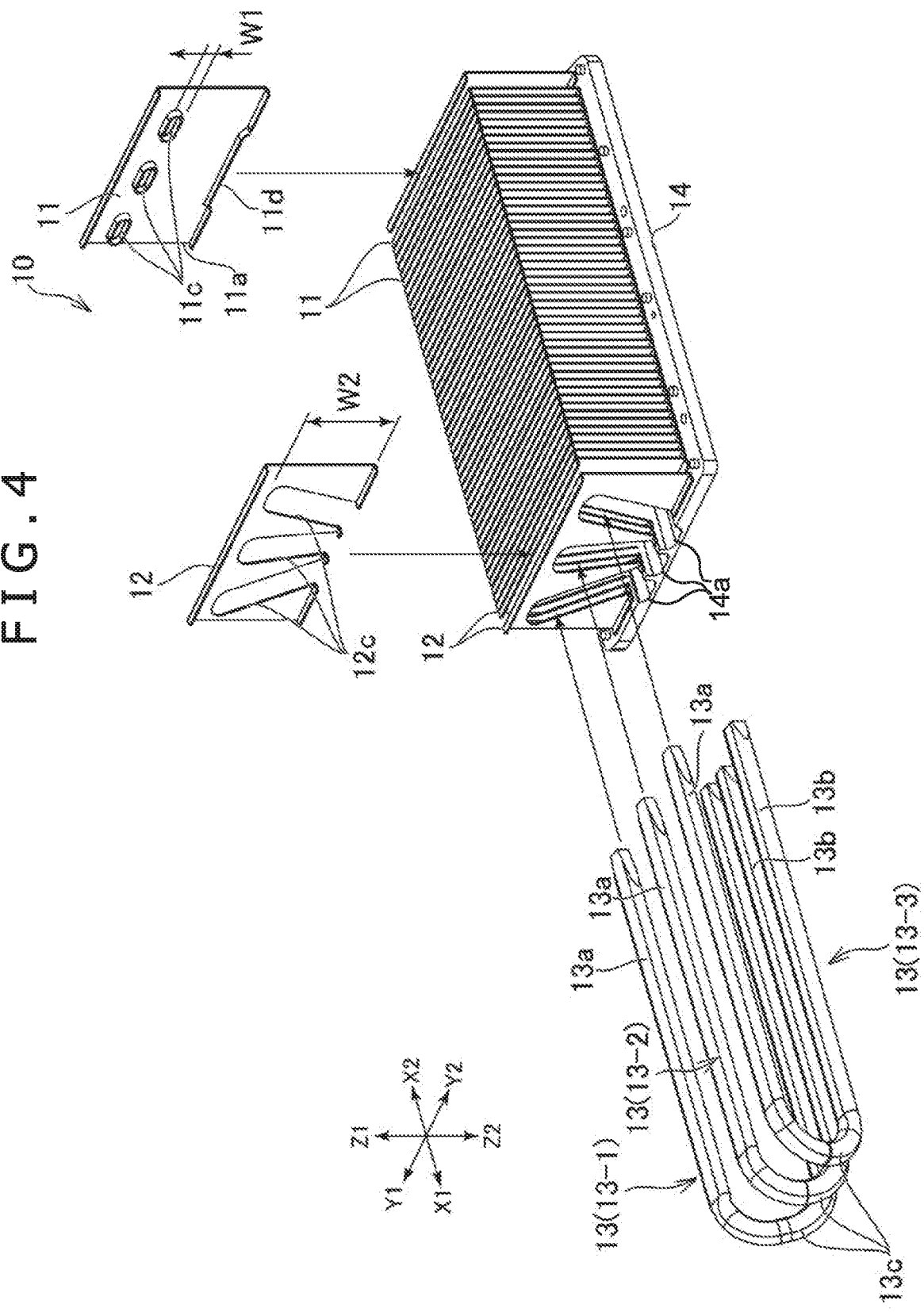
FIG. 4 is an exploded perspective view of the heat sink depicted in FIG. 1.
Figure 5:
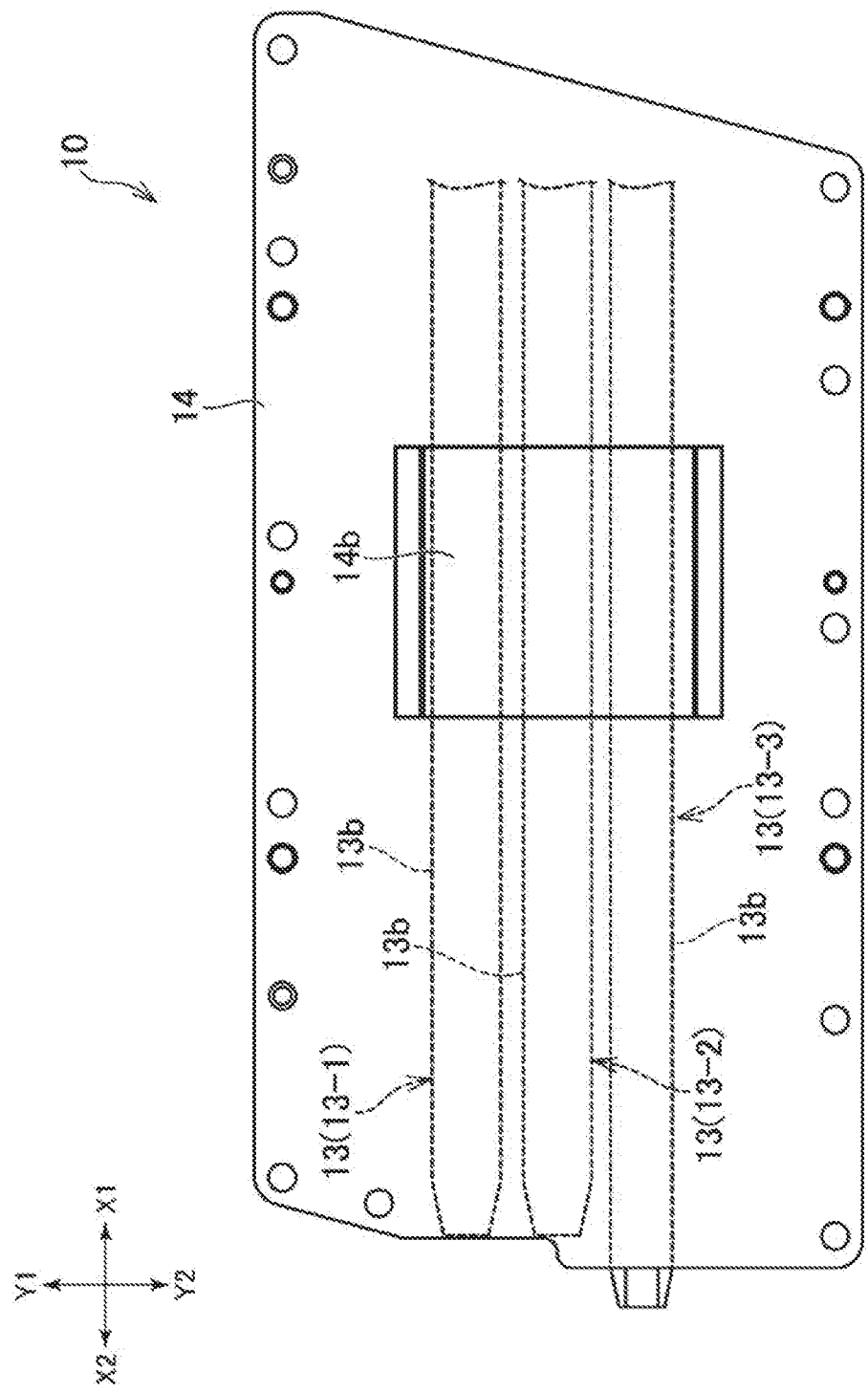
FIG. 5 is a bottom view of the heat sink depicted in FIG. 1.

An embodiment of the present disclosure will be described below with reference to the drawings. FIG. 1 depicts in perspective a heat sink 10 according to the embodiment of the present disclosure. A rear side of the heat sink 10 is depicted in FIG. 1. FIG. 2 depicts the heat sink 10 in plan. FIG. 3 depicts in side elevation the heat sink 10 as viewed in the direction indicated by the arrow III in FIG. 2. FIG. 4 depicts the heat sink 10 in exploded perspective. FIG. 5 depicts the heat sink 10 in bottom view.

In the description that follows, the directions indicated by arrows X1 and X2 in FIG. 1 will be referred to as rightward and leftward directions, respectively, the directions indicated by arrows Y1 and Y2 as forward and rearward directions, respectively, and the directions indicated by arrows Z1 and Z2 as vertical or upward and downward directions, respectively.

As depicted in FIG. 1, the heat sink 10 includes a plurality of heat pipes, e.g., three heat pipes which specifically include heat pipes 13-1, 13-2, and 13-3. The heat pipes of the heat sink 10 are not limited to three heat pipes, but the heat sink 10 may include a single heat pipe, two heat pipes, or four or more heat pipes. The heat pipes 13-1, 13-2, and 13-3 will hereinafter be referred to as heat pipes 13 where they do not need to be distinguished from each other.

As depicted in FIG. 4, the heat pipes 13 include respective first extensions 13a extending in the leftward and rightward directions. The heat pipes 13 also include respective second extensions 13b spaced vertically from the respective first extensions 13a as viewed along the forward and rearward directions and extending in the leftward and rightward directions (see also FIG. 3). The first extensions 13a are positioned in an upper portion of the heat sink 10, whereas the second extensions 13b are positioned in a lower portion of the heat sink 10. The heat pipes 13 further include respective joints 13c that interconnect the first extensions 13a and the second extensions 13b. The joints 13c extend downwardly from the first extensions 13a as curved portions, and are connected to the respective second extensions 13b. Therefore, the heat pipes 13 are of a substantially U shape that is open to the right or left. In the illustrated heat sink 10, the joints 13c interconnect the right ends of the first extensions 13a and the right ends of the second extensions 13b. Alternatively, the joints 13c may interconnect the left ends of the first extensions 13a and the left ends of the second extensions 13b.

As depicted in FIG. 4, the heat sink 10 includes a plurality of fins 11 and 12 arrayed in the leftward and rightward directions. The heat sink 10 also includes a heat receiver 14 which will be held in contact with heat generating components such as integrated circuits when the heat sink 10 is in use. The heat receiver 14 is in the form of a plate-like or block (thick plate)-like member. The heat receiver 14 is disposed at the lower end of the heat sink 10, and the fins 11 and 12 are fixed to an upper surface of the heat receiver 14. The heat receiver 14 is made of metal such as aluminum, copper, or the like, for example. The fins 11 and 12 include plates of metal such as aluminum or the like, for example. The fins 11 and 12 may be made of copper. The fins 11 and 12 have respective lower edges joined as by welding to the upper surface of the heat receiver 14. The fins 11 and 12 and the heat receiver 14 may be integrally formed with each other.

As depicted in FIG. 4, the fins 11 and 12 are grouped into two types. Specifically, the fins 11 and 12 include a plurality of first fins 11 and a plurality of second fins 12. The first fins 11 are arrayed in the leftward and rightward directions along the first extensions 13a and the second extensions 13b of the heat pipes 13. When the heat sink 10 is viewed in plan, the first extensions 13a and the second extensions 13b of the heat pipes 13 are positioned between front edges 11a (see FIG. 2) and rear edges 11b (see FIG. 2) of the first fins 11. When the heat sink 10 is viewed in front elevation, at least part of each of the first fins 11 is positioned between the first extensions 13a and the second extensions 13b (see FIG. 3). This structure allows the heat pipes 13 to transfer heat to a wide range of the first fins 11.

As depicted in FIG. 4, in the illustrated heat sink 10, the first fins 11 have first through passageways 11c defined as holes extending through the first fins 11. The first extensions 13a of the heat pipes 13 are inserted in the first through passageways 11c of the respective first fins 11. The first through passageways 11c have respective inner peripheral edges held in contact with the outer surfaces of the first extensions 13a. The inner peripheral edges of the first through passageways 11c may be joined by welding to the outer surfaces of the first extensions 13a. Since the heat sink 10 includes a plurality of (specifically, three) heat pipes 13, as described above, each of the first fins 11 has a plurality of (specifically, three) first through passageways 11c.

Alternatively, the first extensions 13a of the heat pipes 13 may be inserted in a single through passageway defined in each of the first fins 11. For example, each of the first fins 11 may have a single through hole, larger than the first through passageway 11c, defined therein, and the three heat pipes 13 may be inserted in the single through hole. Further alternatively, each of the first fins 11 may include a recess or upwardly open cavity defined in an upper edge thereof as a first through passageway 11c, and the first extensions 13a may be inserted in the recess whose edge may be held in contact with the outer surfaces of the first extensions 13a. According to another alternative, the first extensions 13a of the heat pipes 13 may be disposed over the upper edges of the first fins 11 and held in contact with the upper edges of the first fins 11.

As depicted in FIG. 4, in the illustrated heat sink 10, the second extensions 13b of the heat pipes 13 are disposed under lower edges 11d of the first fins 11. The second extensions 13b are held in contact with the lower edges 11d of the first fins 11. The second extensions 13b may have their outer surfaces joined as by welding to the lower edges 11d of the first fins 11. Alternatively, each of the first fins 11 may have through passageways in the form of through holes or recesses defined in a lower portion thereof, and the second extensions 13b of the heat pipes 13 may be inserted in those through passageways.

As depicted in FIGS. 1 and 3, the second fins 12 are disposed around the positions of the joints 13c of the heat pipes 13. When the heat sink 10 is viewed in plan, the joints 13c are positioned between front edges 12a (see FIG. 2) and rear edges 12b (see FIG. 2) of the second fins 12. Specifi- cally, when the heat sink 10 is viewed in plan, the curved portions of the heat pipes 13 are positioned between the front edges 12a (see FIG. 2) and the rear edges 12b (see FIG. 2) of the second fins 12. When the heat sink 10 is viewed in front elevation, the joints 13c of the heat pipes 13 extend across the second fins 12. Specifically, when the heat sink 10 is viewed in front elevation, the curved portions of the heat pipes 13 extend across the second fins 12. The heat sink 10 that is provided with the second fins 12 is capable of radiating heat from the second fins 12 via air flowing around the positions of the joints 13c. Therefore, the cooling capability of the heat sink 10 is increased. When the heat sink 10 is in use, i.e., when the heat receiver 14 is placed on integrated circuits, for example, unwanted radiation from the joints 13c of the heat pipes 13 is reduced by the second fins 12.

As depicted in FIG. 4, the second fins 12 have second through passageways 12c defined therein as recesses through which the joints 13c extend. Stated otherwise, the second through passageways 12c serve to avoid physical interference between the second fins 12 and the joints 13c. In the illustrated heat sink 10, the second through passageways 12c are in the form of downwardly open recesses. Since the heat sink 10 includes a plurality of (specifically, three) heat pipes 13, as described above, each of the second fins 12 has a plurality of (specifically, three) second through passageways 12c. Alternatively, the joints 13c of the heat pipes 13 may be disposed in a single through passageway. For example, each of the second fins 12 may have a single recess as a through passageway defined therein, and the joints 13c of the heat pipes 13 may be disposed in the single recess.

As described above, the first fins 11 have the first through passageways 11c defined therein through which the first extensions 13a of the heat pipes 13 extend. As depicted in FIG. 4, a vertical width W2 of the second through passageways 12c in the second fins 12 is larger than a vertical width W1 of the first through passageways 11c in the first fins 11. In the illustrated heat sink 10, the distance W2 from the lower end of the inner peripheral edge of the recesses as the second through passageways 12c in the second fins 12, i.e., the lower edge of the second fins 12, to the upper end of the inner peripheral edge of the recesses, is larger than the diameter W1 in the vertical directions of the holes as the first through passageways 11c in the first fins 11.

Alternatively, the first through passageways 11c in the first fins 11 may be in the form of recesses defined in the upper edges of the first fins 11. In this case, the vertical width W2 of the second through passageways 12c in the second fins 12 is larger than the distance in the vertical directions from the upper end of the inner peripheral edge of the recesses as the first through passageways 11c to the lower end of the inner peripheral edge of the recesses as the first through passageways 11c.

Further alternatively, the second fins 12 may have holes defined therethrough as second through passageways 12c for avoiding physical interference between the joints 13c of the heat pipes 13 and the second fins 12. In this case, the diameter in the vertical directions of the holes as the second through passageways 12c is larger than the width in the vertical directions of the first through passageways 11c in the first fins 11.

Still further alternatively, the first extensions 13a of the heat pipes 13 may be disposed over the upper edges of the first fins 11. In this case, the first fins 11 are free of first through passageways 11c in the form of holes or recesses, and the second fins 12 have second through passageways 12c in the form of holes or recesses.

The heat sink 10 includes the plural second fins 12 arrayed in the leftward and rightward directions. The joints 13c of the heat pipes 13 extend across the second fins 12 at different positions depending on the second fins 12. For example, the second fin 12 positioned at the right end of the second fin array, i.e., the second fin denoted by 12(R) in FIG. 3, has a lower portion extending across the joints 13c of the heat pipes 13. The second fin 12 positioned at the left end of the second fin array, i.e., the second fin denoted by 12(L) in FIG. 3, has an upper portion and a lower end extending across the joints 13c of the heat pipes 13. The second through passageways 12c defined in the second fins 12 are of the same shape and size irrespective of the positions of the second fins 12. Stated otherwise, the second fins 12 are identical in shape to each other. The second fins 12 thus constructed are effective to reduce the number of steps may be required to manufacture the heat sink 10.

In the illustrated heat sink 10, the inner peripheral edges of the recesses as the second through passageways 12c are not held in contact with the outer surfaces of the joints 13c of the heat pipes 13. Instead, the inner peripheral edges of the second through passageways 12c may be held in contact with the outer surfaces of the joints 13c of the heat pipes 13. In this case, the inner peripheral edges of the second through passageways 12c may be welded to the outer surfaces of the joints 13c of the heat pipes 13.

As depicted in FIG. 2, in the illustrated heat sink 10, the second fins 12 are disposed parallel to each other. The second fins 12 are also disposed parallel to one of the first fins 11 which is disposed adjacent to the second fins 12. In the illustrated heat sink 10, the first fins 11 are disposed parallel to each other, so that all the fins 11 and 12 are disposed parallel to each other. When the heat sink 10 is in use, the parallel fins 11 and 12 allow air to pass smoothly therebetween. In the illustrated heat sink 10, as depicted in FIG. 2, the fins 11 and 12 are inclined to both straight lines along the leftward and rightward directions and straight lines along the forward and rearward directions, as viewed in plan. Alternatively, each of the fins 11 and 12 may be disposed parallel to straight lines along the forward and rearward directions.

As depicted in FIG. 3, the first fins 11 are spaced at intervals D1. In the illustrated heat sink 10, one of the first fins 11 which is positioned adjacent to the second fins 12, i.e., the first fin denoted by 11-1 in FIG. 3, is spaced from the closest second fin 12, i.e., the second fin denoted by 12(L) in FIG. 3, by an interval which is the same as the intervals D1 at which the first fins 11 are spaced. The second fins 12 are also spaced at the same intervals as the intervals D1 at which the first fins 11 are spaced. The second fins 12 are not limited to the layout in the illustrated heat sink 10. The intervals at which the second fins 12 are spaced may not be the same as the intervals D1 at which the first fins 11 are spaced.

As depicted in FIG. 4, in the illustrated heat sink 10, the width of the second fins 12 in the forward and rearward directions is the same as the width of the first fins 11 in the forward and rearward directions. The width of the second fins 12 in the upward and downward directions is the same as the width of the first fins 11 in the upward and downward directions. Consequently, the process for manufacturing the fins 11 and 12 is simplified. As described above, the fins 11 and 12 include plates of metal. The fins 11 and 12 have their upper and lower edges bent in the leftward and rightward directions, and connected to adjacent fins 11 and 12. The widths of the second fins 12 in the forward and rearward directions and in the upward and downward directions may not be the same as those of the first fins 11.

As described above, the lower edges of the first fins 11 and the lower edges of the second fins 12 are joined to the heat receiver 14. Part of the heat transferred from the heat generating components such as integrated circuits and received by the heat receiver 14 is transmitted from the heat receiver 14 to the second fins 12, and radiated from the second fins 12. Other part of the heat transferred to the heat receiver 14 is transmitted from the heat receiver 14 to the first fins 11. The second extensions 13b of the heat pipes 13 are held in contact with the heat receiver 14. Therefore, part of the heat transferred from the heat generating components and received by the heat receiver 14 is transmitted from the heat receiver 14 to the second extensions 13b of the heat pipes 13. The heat transmitted to the second extensions 13b is transmitted through the joints 13c and the first extensions 13a to upper portions of the first fins 11.

As depicted in FIG. 4, the heat receiver 14 includes a plurality of grooves 14a defined therein and extending in the leftward and rightward directions. The second extensions 13b of the heat pipes 13 are disposed in the grooves 14a. As described above, the heat sink 10 includes the plural heat pipes, e.g., three heat pipes, 13. The grooves 14a defined in the heat receiver 14 receive the respective second extensions 13b of the heat pipes 13 therein. In the illustrated heat sink 10, the second extensions 13b of the heat pipes 13 are positioned under the lower edges of the first fins 11. The heat receiver 14 includes the grooves 14a defined in a surface, i.e., an upper surface, thereof to which the lower edges of the first fins 11 are joined. However, the positions of the second extensions 13b are not limited to those in the illustrated heat sink 10. According to an alternative, the heat receiver 14 may have grooves 14a defined in a lower surface thereof, and the second extensions 13b may be disposed in the respective grooves 14a thus defined. Further alternatively, the heat receiver 14 may have holes defined therein and extending in the rightward and leftward directions and the second extensions 13b may be disposed in the respective holes thus defined.

As depicted in FIG. 4, the first extensions 13a of the heat pipes 13 extend straight in the leftward and rightward directions. Therefore, the first through passageways 11c are defined at the same positions in the first fins 11. Specifically, the first through passageways 11c defined in the first fins 11 are arrayed in the leftward and rightward directions. More specifically, the first through passageways 11c in which the first extension 13a of the heat pipe 13-1, for example, is inserted are arrayed along a straight line extending in the leftward and rightward directions. The through passageways 11c in which the first extensions 13a of the other heat pipes 13-2 and 13-3 are inserted are also arrayed likewise. In the illustrated heat sink 10, the second extensions 13b of the heat pipes 13 also extend straight in the leftward and rightward directions. Accordingly, the grooves 14a defined in the heat receiver 14 also extend straight in the leftward and rightward directions. The second through passageways 12c defined in the second fins 12 have the vertical width W2 larger than the vertical width W1 of the first through passageways 11c in the first fins 11. With this structure, when the heat sink 10 is to be manufactured, the first fins 11 and the second fins 12 are fixed to the heat receiver 14 by soldering or the like, and thereafter the first extensions 13a and the second extensions 13b of the heat pipes 13 can be inserted respectively in the first through passageways 11c in the first fins 11 and the grooves 14a.

As described above, the heat sink 10 includes the plural heat pipes 13. The first extensions 13a of the heat pipes 13 extend parallel to each other. The second extensions 13b of the heat pipes 13 also extend parallel to each other. The first extensions 13a and the second extensions 13b of the heat pipes 13 also extend parallel to each other. The shape of the heat pipes 13 is not limited to that in the illustrated heat sink 10. According to an alternative, the first extensions 13a and the second extensions 13b may not extend parallel to each other. The second extensions 13b may not extend straight. The second extensions 13b may be curved somewhere in their lengths. Even if the second extensions 13b are curved somewhere in their lengths, they extend in the leftward and rightward directions when the heat sink 10 is viewed in the forward and rearward directions. In this case, the grooves 14a defined in the heat receiver 14 may be curved in conformity with the curved second extensions 13b.

As described above, the heat sink 10 includes the plural heat pipes, e.g., three heat pipes, 13-1, 13-2, and 13-3. The heat pipes 13-1, 13-2, and 13-3 are arrayed in the forward and rearward directions. The heat pipes 13-1, 13-2, and 13-3 will hereinafter be referred to as a first heat pipe 13-1, a second heat pipe 13-2, and a third heat pipe 13-3, respectively. In the illustrated heat sink 10, the first heat pipe 13-1, the second heat pipe 13-2, and the third heat pipe 13-3 are arranged in the order named successively from the front side to rear side of the heat sink 10.

As depicted in FIG. 2, when the heat sink 10 is viewed in plan, the first extension 13a of the first heat pipe 13-1 and the second extension 13b of the first heat pipe 13-1 are positionally displaced in the forward and rearward directions. Specifically, the first extension 13a of the first heat pipe 13-1 is positioned forwardly of the second extension 13b of the first heat pipe 13-1. The first heat pipe 13-1 thus configured is able to transmit heat received by the heat receiver 14 effectively to front portions of the first fins 11. The joint 13c of the first heat pipe 13-1 extends upwardly from the end of the second extension 13b, is inclined in the forward direction, and is joined to the first extension 13a.

As depicted in FIG. 2, when the heat sink 10 is viewed in plan, the first extension 13a of the third heat pipe 13-3 and the second extension 13b of the third heat pipe 13-3 are also positionally displaced in the forward and rearward directions. Specifically, the first extension 13a of the third heat pipe 13-3 is positioned rearwardly of the second extension 13b of the third heat pipe 13-3. The third heat pipe 13-3 thus configured is able to transmit heat received by the heat receiver 14 effectively to rear portions of the first fins 11. The joint 13c of the third heat pipe 13-3 extends upwardly from the end of the second extension 13b, is inclined in the rearward direction, and is joined to the first extension 13a.

In the illustrated heat sink 10, the first extension 13a of the second heat pipe 13-2 is positioned slightly forwardly of the second extension 13b of the second heat pipe 13-2. The first extension 13a of the second heat pipe 13-2 may alternatively be in the same position as the second extension 13b of the second heat pipe 13-2 in the forward and rearward directions.

The intervals in the forward and rearward directions between the first extensions 13a of the heat pipes 13-1, 13-2, and 13-3 are larger than the intervals in the forward and rearward directions between the second extensions 13b of the heat pipes 13-1, 13-2, and 13-3. For example, as depicted in FIG. 2, the interval between the first extension 13a of the first heat pipe 13-1 and the first extension 13a of the third heat pipe 13-3 is larger than the interval between the second extension 13b of the first heat pipe 13-1 and the second extension 13b of the third heat pipe 13-3. With this structure, even if the widths in the forward and rearward directions of the heat generating components such as integrated circuits or the like are smaller than the widths in the forward and rearward directions of the first fins 11, heat of the heat generating components can effectively be transmitted to the front and rear portions of the first fins 11.

As depicted in FIG. 5, in the illustrated heat sink 10, the heat receiver 14 includes a highly conductive portion 14b partly therein. The highly conductive portion 14b is made of a material different from the rest of the heat receiver 14. Specifically, the highly conductive portion 14b is made of a material whose thermal conductivity is higher than the rest of the heat receiver 14. For example, the highly conductive portion 14b is made of copper, and the rest of the heat receiver 14 is made of aluminum. In the illustrated heat sink 10, the heat receiver 14 has a hole or cavity defined centrally therein, and the highly conductive portion 14b is fitted in the hole or cavity. When the heat sink 10 is in use, the heat generating components such as integrated circuits or the like are held in contact with the highly conductive portion 14b. The second extensions 13b of the heat pipes 13-1, 13-2, and 13-3 are kept in positional alignment with the highly conductive portion 14b and held in contact with the highly conductive portion 14b. With this structure, heat of the heat generating components can effectively be transmitted to the heat pipes 13-1, 13-2, and 13-3. In the illustrated heat sink 10, the second extensions 13b of the heat pipes 13-1, 13-2, and 13-3 are positioned directly over the highly conductive portion 14b and held in contact with the highly conductive portion 14b.

Figure 6:
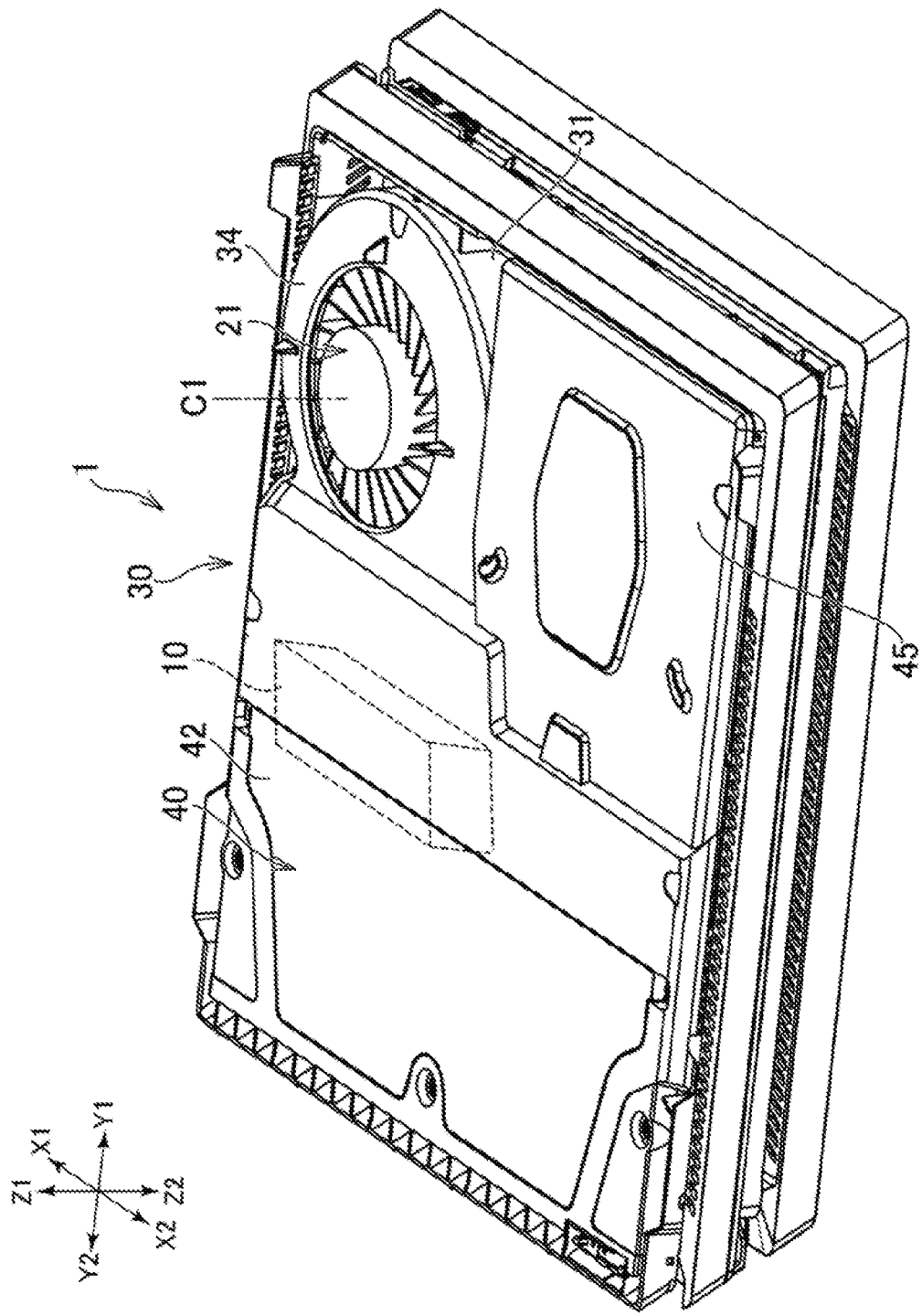
FIG. 6 is a perspective view depicting by way of example an electronic device which incorporates the heat sink therein.
Figure 7:
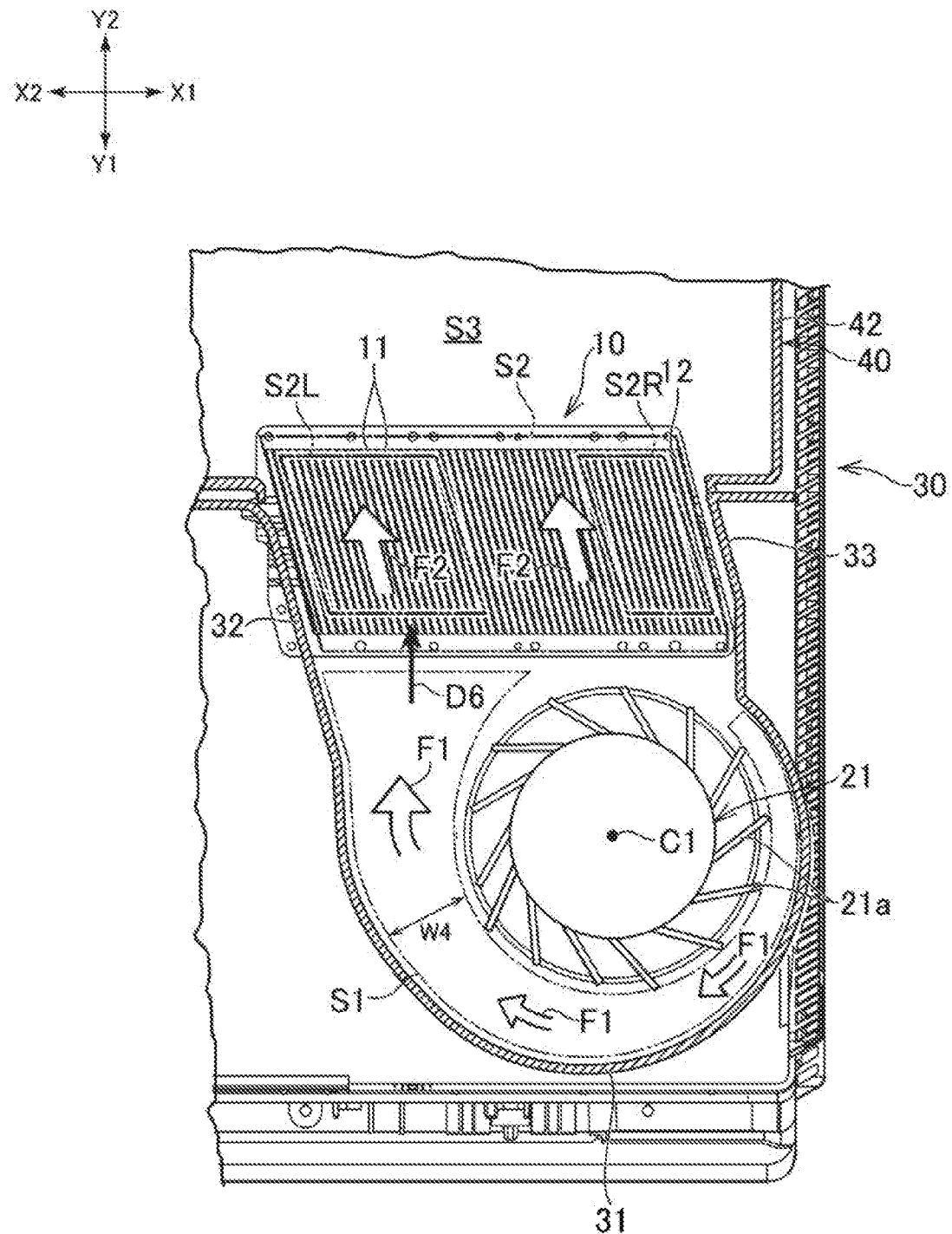
FIG. 7 is a fragmentary plan view of the electronic device, depicting air flow paths defined in the electronic device depicted in FIG. 6, where a power supply unit depicted in FIG. 6 and an upper wall defining some of the air flow paths are omitted from illustration.

FIGS. 6 and 7 are views depicting by way of example an electronic device which incorporates the heat sink 10 therein. FIG. 6 depicts an electronic device 1 in perspective. In FIG. 6, a cover that provides an upper surface of the electronic device 1 is omitted from illustration, depicting the inside of the electronic device 1. FIG. 7 depicts in fragmentary plan air flow paths S1, S2, and S3 defined in the electronic device depicted in FIG. 6. In FIG. 7, a power supply unit 40 depicted in FIG. 6 and an upper wall 34 defining the air flow paths S1 and S2 are omitted from illustration.

The electronic device 1 includes an entertainment device functioning as a game device or an audio-visual device, for example. The electronic device 1 outputs moving-image data generated by executing game programs, video and audio data acquired from recording mediums such as optical discs, and/or video and audio data acquired via networks, to a display device such as a television set. The electronic device 1 is not limited to an entertainment device such as a game device or the like, but may be a personal computer.

As depicted in FIG. 6, the electronic device 1 includes a cooling fan 21 in its front part. The cooling fan 21 is disposed such that its rotational central axis C1 is oriented in the vertical, i.e., upward and downward directions. As depicted in FIG. 7, the electronic device 1 has a first air flow path S1 defined around the cooling fan 21. The electronic device 1 includes a curved wall 31 which is curved in surrounding relation to the cooling fan 21, with the first air flow path S1 being defined between the curved wall 31 and fins 21a of the cooling fan 21. A second air flow path S2 is defined behind the first air flow path S1. The first air flow path S1 has a width W4 (see FIG. 7) that is progressively larger toward the second air flow path S2, i.e., downstream from the first air flow path S1 toward the second air flow path S2.

The electronic device 1 includes a first side wall 32 extending rearwardly from an end of the curved wall 31 and a second side wall 33 extending rearwardly from the other end of the curved wall 31. The first side wall 32 and the second side wall 33 are spaced from each other in mutually acing relation in the leftward and rightward directions. The second air flow path S2 is defined between the first side wall 32 and the second side wall 33. When the cooling fan 21 is actuated, an air flow indicated by arrows F1 in FIG. 7 is generated in the first air flow path S1, and an air flow indicated by arrows F2 is generated in the second air flow path S2. In the illustrated electronic device 1, the heat sink 10 is disposed in the second air flow path S2.

The electronic device 1 includes a frame 30. The frame 30 is made of resin, for example. On the frame 30, there are mounted an optical disc drive 45 (see FIG. 6), a power supply unit 40 (see FIG. 6), etc. The power supply unit 40 generates electric power for energizing integrated circuits and the cooling fan 21 from electric power received from an external power supply system. The frame 30 surrounds the outer sides of the power supply unit 40, the optical disk drive 45, and the cooling fan 21. A circuit board, not depicted, is attached to a lower side of the frame 30. The integrated circuits (heat generating components) which include a central processing unit (CPU), a graphics processing unit (GPU), etc. are installed on the circuit board. The heat sink 10 is disposed over the integrated circuits. As depicted in FIG. 6, the frame 30 includes an upper wall 34 covering and defining the first air flow path S1 and the second air flow path S2. In the illustrated electronic device 1, the curved wall 31, the first side wall 32, and the second side wall 33 are integrally formed with the frame 30.

The power supply unit 40 is disposed in a rear portion of the electronic device 1. As depicted in FIG. 7, the power supply unit 40 includes a case 42 housing therein a circuit board, not depicted, on which a power supply circuit is installed. The case 42 defines therein a third air flow path S3 that follows the second air flow path S2. The third air flow path S3 receives air from the second air flow path S2 and discharges the received air from a discharge port defined in a rear side of the electronic device 1.

In the second air flow path S2, the air flow has different speeds at different locations. In the illustrated electronic device 1, as depicted in FIG. 7, the second air flow path S2 spreads to the right from the most downstream portion of the first air flow path S1. Therefore, the speed of the air flow in a left area S2L of the second air flow path S2 is higher than the speed of the air flow in a right area S2R of the second air flow path S2. The left area S2L is positioned directly in line with the direction of the air flow, i.e., the direction indicated by an arrow D6 in FIG. 7, from the most downstream portion of the first air flow path S1. The right area S2R is positioned obliquely to the direction of the air flow from the most downstream portion of the first air flow path S1. The heat sink 10 is disposed in the second air flow path S2 such that the joints 13c of the heat pipes 13 are positioned in an area where the air flow is slower, i.e., in the right area S2R of the illustrated electronic device 1. Stated otherwise, the heat sink 10 is disposed in the second air flow path S2 such that the portions of the heat pipes 13 remote from the joints 13c are positioned in an area where the air flow is faster, i.e., in the left area S2L of the illustrated electronic device 1. Therefore, it necessarily follows that the "portions" (which may be referred to as "respective other portions") of the first extensions 13a and the second extensions 13b of the first, second, and third heat pipes 13-1, 13-2, 13-2, which are distant from the respective joints 13c are located in the first flow area S2L. It also necessarily follows that "respective portions" of the first extensions 13a and the second extensions 13b of the first, second, and third heat pipes 13-1, 13-2, 13-2, which are adjacent to (i.e., relatively close to) the respective joints 13c, are positioned obliquely to the direction of the air flow from the most downstream portion of the first air flow path S1. It further necessarily follows that, since the "respective portions" of the first and second extensions 13a, 13b (which are relatively close to the joints 13c) are positioned obliquely to the direction of the air flow from the most downstream portion of the first air flow path S1, the "respective portions" of the first and second extensions 13a, 13b are located in the second flow area S2R. In the illustrated heat sink 10, the first fins 11 are held in contact with the outer surfaces of the heat pipes 13 in the first through passageways 11c, whereas the second fins 12 are held out of contact with the outer surfaces of the heat pipes 13. Therefore, heat of the heat receiver 14 is more liable to be transmitted to the first fins 11 than to the second fins 12. The above layout of the heat sink 10 in the second air flow path S2 is effective to increase the cooling capability of the heat sink 10 as the faster air flow passes the first fins 11.

As depicted in FIG. 7, the cooling fan 21 and the heat sink 10 are disposed in a right portion of the electronic device 1. The width in the leftward and rightward directions of the third air flow path S3 defined by the case 42 of the power supply unit 40 is larger than the width in the leftward and rightward directions of the second air flow path S2. As described above, the fins 11 and 12 of the heat sink 10 are inclined to both straight lines along the leftward and rightward directions and straight lines along the forward and rearward directions (see FIG. 2). More specifically, the fins 11 and 12 of the heat sink 10 extend obliquely in the rearward and leftward directions as viewed in plan. The fins 11 and 12 thus inclined cause the air that has left the second air flow path S2 to spread to the left in the third air flow path S3.

As depicted in FIG. 7, the first side wall 32 that defines the second air flow path S2 is formed along the first fins 11 of the heat sink 10. Specifically, the first side wall 32 is inclined to both straight lines along the leftward and rightward directions and straight lines along the forward and rearward directions, in conformity with the first fins 11 of the heat sink 10. In the illustrated electronic device 1, the first side wall 32 extends obliquely in the rearward and leftward directions as viewed in plan.

Similarly, the second side wall 33 that defines the second air flow path S2 is formed along the second fins 12 of the heat sink 10. Specifically, the second side wall 33 is inclined to both straight lines along the leftward and rightward directions and straight lines along the forward and rearward directions, in conformity with the second fins 12 of the heat sink 10. In the illustrated electronic device 1, the second side wall 33 extends obliquely in the rearward and leftward directions as viewed in plan.

The side walls 32 and 33 thus inclined are effective to keep the heat sink 10 free of unwanted spaces on the right and left sides thereof, with the result that the heat sink 10 can effectively use air flows.

As described above, the heat sink 10 has the heat pipes 13 that include the first extensions 13a and the second extensions 13b which are vertically spaced from the first extensions 13a when the heat pipes 13 are viewed in the forward and rearward directions. The heat pipes 13 also include the joints 13c which interconnect the first extensions 13a and the second extensions 13b and which are curved. The heat sink 10 includes the first fins 11 arrayed along the first extensions 13a and the second extensions 13b and the second fins 12 disposed around the positions of the joints 13c. The heat sink 10 is capable of radiating heat from the second fins 12 via air flowing around the positions of the joints 13c. The cooling capability of the heat sink 10 is thus increased.

The present disclosure is not limited to the illustrated structural details of the heat sink 10 and the electronic device 1, but various changes and modifications may be made to the heat sink 10 and the electronic device 1.

For example, the illustrated heat sink 10 includes the plural second fins 12. However, the present disclosure is also applicable to a heat sink including a single second fin rather than a plurality of second fins.

In the illustrated heat sink 10, the second fins 12 have the second through passageways 12c for avoiding physical interference between the second fins 12 and the joints 13c of the heat pipes 13. Each of the second fins 12 may include a plurality of plate-like members arrayed in the forward and rearward directions. For example, each of the second fins 12 may include two plate-like members arrayed in the forward and rearward directions, with the joints 13c of the heat pipes 13 being positioned between the two plate-like members.

The present disclosure contains subject matter related to that disclosed in Japanese Priority Patent Application JP 2016-152221 filed in the Japan Patent Office on Aug. 2, 2016, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device comprising:
   a cooling fan;
   a first air flow path formed around the cooling fan and includes a most downstream portion thereof;
   a second air flow path connected to, and spreading from a most downstream portion of the first air flow path; and
   a heat sink disposed in the second air flow path, the heat sink including:
   a first plurality of fins arrayed in a first direction;
   a second plurality of fins arrayed in the first direction
   a first heat pipe including a first extension and a second extension, each extending in the first direction, and a curved joint which interconnects the first extension and the second extension,
   wherein:
   a second direction extends perpendicularly to the first direction, and a third direction extends perpendicularly to the first direction and the second direction, and when the first heat pipe is viewed in the third direction, the second extension is spaced from the first extension in the second direction,
   the first plurality of fins are arrayed along the first extension and the second extension, and the second plurality of fins are arrayed along and disposed around the joint,
   the plurality of first fins are contacted with the first heat pipe and the plurality of second fins are not contacted with the first heat pipe,
   the second air flow path has a first flow area and a second flow area, adjacent to one another, the first flow area is located in the direction of the air flow from the most downstream portion of the first air flow path, the second flow area is located obliquely to the direction of the air flow from the most downstream portion of the first air flow path, a first air flow rate of an air flow generated in the first flow area is greater than a second air flow rate of an air flow generated in the second flow area,
   the heat sink is disposed in the second air flow path such that: (i) the joint is located in the second flow area, (ii) other portions of the first extension and the second extension are located in the first flow area, and (iii) the plurality of first fins are located in the first area and the plurality of second fins are located in the second area.

2. The electronic device according to claim 1, wherein each of the second fins has a second through passageway defined therein as a hole or recess in which one of the joints is disposed.

3. The electronic device according to claim 2, wherein
   the first fins have respective first through passageways defined therein as holes or recesses through which the first extensions extend, and
   a width of the second through passageway in the second direction is larger than a width of the first through passageways in the second direction.

4. The electronic device according to claim 2, wherein the second through passageways are identical in shape to each other.

5. The electronic device according to claim 1, wherein one of the second fins lies parallel to one of the first fins, which is disposed adjacent thereto.

6. The electronic device according to claim 5, wherein
   each of the first fins are spaced at intervals, and
   an interval between the one of the second fins and the one of the first fins is substantially equal to the intervals at which the first fins are spaced.

7. The electronic device according to claim 1, wherein when the heat sink is viewed in the second direction, the first extension and the second extension of the first heat pipe are positionally displaced in the third direction.

8. The electronic device according to claim 1, wherein:
   the electronic device includes a second heat pipe including a first extension and a second extension, each extending in the first direction, and a curved joint which interconnects the first extension and the second extension of the second heat pipe, and
   a distance between the first extension of the first heat pipe and the first extension of the second heat pipe is larger than a distance between the second extension of the first heat pipe and the second extension of the second heat pipe.

9. The electronic device according to claim 1, further comprising: a heat receiver, wherein the first fins and the second fins are joined to the heat receiver.

10. The electronic device according to claim 1, further comprising:
    a first wall and a second wall facing each other in the first direction and defining the second air flow path therebetween, wherein
    one of the first fins which is positioned at an end of the first fin array is disposed along the first wall, and
    the second fin is disposed along the second wall.

11. The heat sink according to claim 1, wherein:
    the electronic device includes a second heat pipe including a first extension and a second extension, each extending in the first direction, and a curved joint which interconnects the first extension and the second extension of the second heat pipe,
    the electronic device includes a third heat pipe including a first extension and a second extension, each extending in the first direction, and a curved joint which interconnects the first extension and the second extension of the third heat pipe,
the first extension, the second extension, and the joint of the first heat pipe lay in a first plane;
the first extension, the second extension, and the joint of the second heat pipe lay in a second plane;
the first extension, the second extension, and the joint of the third heat pipe lay in a third plane; and
the first, second, and third planes intersect along a common axis.

* * * * *